United States Patent
Kim et al.

(10) Patent No.: US 7,924,624 B2
(45) Date of Patent: Apr. 12, 2011

(54) MEMORY DEVICE AND MEMORY PROGRAMMING METHOD

(75) Inventors: Jae Hong Kim, Seoul (KR); Kyoung Lae Cho, Yongin-si (KR); Dong Hyuk Chae, Seoul (KR); Yong June Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 170 days.

(21) Appl. No.: 12/385,705

(22) Filed: Apr. 16, 2009

(65) Prior Publication Data

US 2009/0296466 A1    Dec. 3, 2009

(30) Foreign Application Priority Data

May 28, 2008  (KR) .................. 10-2008-0049828

(51) Int. Cl.
 *G11C 16/06* (2006.01)
(52) U.S. Cl. .......... 365/185.22; 365/185.09; 365/185.18
(58) Field of Classification Search ............. 365/185.22, 365/185.09, 185.18
See application file for complete search history.

(56) References Cited

U.S. PATENT DOCUMENTS

| 6,996,004 | B1 | 2/2006 | Fastow et al. | |
|---|---|---|---|---|
| 7,120,063 | B1 * | 10/2006 | Liu et al. | 365/185.24 |
| 7,215,577 | B2 * | 5/2007 | Liu et al. | 365/185.24 |
| 7,843,732 | B2 * | 11/2010 | Lee et al. | 365/185.09 |
| 2006/0285392 | A1 | 12/2006 | Incarnati et al. | |
| 2007/0211536 | A1 | 9/2007 | Aritome | |
| 2007/0242522 | A1 | 10/2007 | Hemink | |
| 2007/0279985 | A1 | 12/2007 | Hemink | |

FOREIGN PATENT DOCUMENTS

| KR | 10-2004-0085140 | 10/2004 |
|---|---|---|
| KR | 10-2005-0056114 | 6/2005 |
| KR | 10-0624300 | 9/2006 |
| KR | 10-2006-0134824 | 12/2006 |
| KR | 10-2007-0054594 | 5/2007 |
| KR | 10-0794311 | 1/2008 |

* cited by examiner

*Primary Examiner* — Pho M. Luu
(74) *Attorney, Agent, or Firm* — Harness, Dickey & Pierce, P.L.C.

(57) ABSTRACT

Provided are memory devices and memory programming methods. A memory device may include: a multi-bit cell array that includes a plurality of memory cells; a controller that extracts state information of each of the memory cells, divides the plurality of memory cells into a first group and a second group, assigns a first verify voltage to memory cells of the first group and assigns a second verify voltage to memory cells of the second group; and a programming unit that changes a threshold voltage of each memory cell of the first group until the threshold voltage of each memory cell of the first group is greater than or equal to the first verify voltage, and changes a threshold voltage of each memory cell of the second group until the threshold voltage of each memory cell of the second group is greater than or equal to the second verify voltage.

21 Claims, 7 Drawing Sheets

MEMORY DEVICE AND MEMORY PROGRAMMING METHOD

PRIORITY STATEMENT

This application claims priority under 35 U.S.C. §119 to Korean Patent Application No. 10-2008-0049828, filed on May 28, 2008, in the Korean Intellectual Property Office (KIPO), the entire contents of which are incorporated herein by reference.

BACKGROUND

1. Field

Example embodiments relate to apparatuses and/or methods that may program data. Also, example embodiments relate to apparatuses and/or methods that may change a threshold voltage of a memory cell included in memory devices to program data in the memory cell.

2. Description of Related Art

A single-level cell (SLC) memory device may store one bit of data in a single memory cell. The SLC memory may be referred to as a single-bit cell (SBC) memory. A process of storing one bit of data in a single level cell of the SLC memory device may be referred to as a programming process and may change a threshold voltage of the single level cell. For example, when data of logic value "1" is stored in a single level cell, the single level cell may have a threshold voltage of 1.0 V. When data of logic value "0" is stored in the single level cell, the single level cell may have a threshold voltage of 3.0 V.

Due to a minute electrical characteristic difference between single level cells, the threshold voltages formed in each of the single level cells which have the same data programmed may form a distribution within a predetermined range. For example, when a voltage read from a memory cell is greater than 0.5 V and less than 1.5 V, it may be determined that data stored in the memory cell has a logic value of "1". When the voltage read from the memory cell is greater than 2.5 V and less than 3.5 V, it may be determined that the data stored in the memory cell has a logic value of "0". The data stored in the memory cell may be classified depending on the difference between memory cell currents/voltages during the reading operations.

Meanwhile, a multi-bit cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To program 'm' bits in a single memory cell, any one of $2^m$ threshold voltages may be required to be formed in the memory cell. Due to the minute electrical characteristic difference between memory cells, threshold voltages of memory cells which have the same data programmed may form a distribution within a predetermined range. A single threshold voltage distribution may correspond to each of $2^m$ data values that can be generated according to 'm' bits.

However, since the voltage window of a memory may be limited, the distance between $2^m$ distributions of threshold voltage between adjacent bits may decrease as 'm' increases, which may cause overlapping of the distributions. If the distributions are overlapped with each other, the read failure rate may increase.

SUMMARY

Example embodiments may provide apparatuses and/or methods that may reduce a distribution width of a threshold voltage of a memory cell using a new programming method.

Example embodiments may provide apparatuses and/or methods that may reduce an error occurring when reading data from a memory cell, using a new programming method.

A memory device according to example embodiments may include: a multi-bit cell array that includes a plurality of memory cells; a controller that extracts state information of each of the memory cells, divides the plurality of memory cells into a first group and a second group based on the extracted state information, assigns a first verify voltage to memory cells of the first group and assigns a second verify voltage to memory cells of the second group; and a programming unit that changes a threshold voltage of each memory cell of the first group until the threshold voltage of each memory cell of the first group is greater than or equal to the first verify voltage, and changes a threshold voltage of each memory cell of the second group until the threshold voltage of each memory cell of the second group is greater than or equal to the second verify voltage.

A memory programming method according to example embodiments may include: setting a verify voltage of a plurality of memory cells as a first voltage level; applying a first program voltage to a gate terminal of each of the memory cells to increase a threshold voltage of each of the memory cells; when a number of first memory cells with the threshold voltage greater than or equal to the verify voltage among the plurality of memory cells is greater than or equal to a threshold after the first program voltage is applied, resetting a verify voltage of remaining memory cells excluding the first memory cells from the plurality of memory cells as a second voltage level greater than the first voltage level; and applying a second program voltage to the gate terminal of each of the memory cells.

A memory programming method according to example embodiments may include: setting a verify voltage of a plurality of memory cells as a first voltage level; applying, a number of times corresponding to a threshold, a first program voltage to a gate terminal of each of the memory cells; after the first program voltage is applied the number of times corresponding to the threshold, resetting a verify voltage of remaining memory cells excluding the first memory cell with the threshold voltage greater than or equal to the verify voltage from the plurality of memory cells as a second voltage level greater than the first voltage level; and applying a second program voltage to the gate terminal of each of the memory cells.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
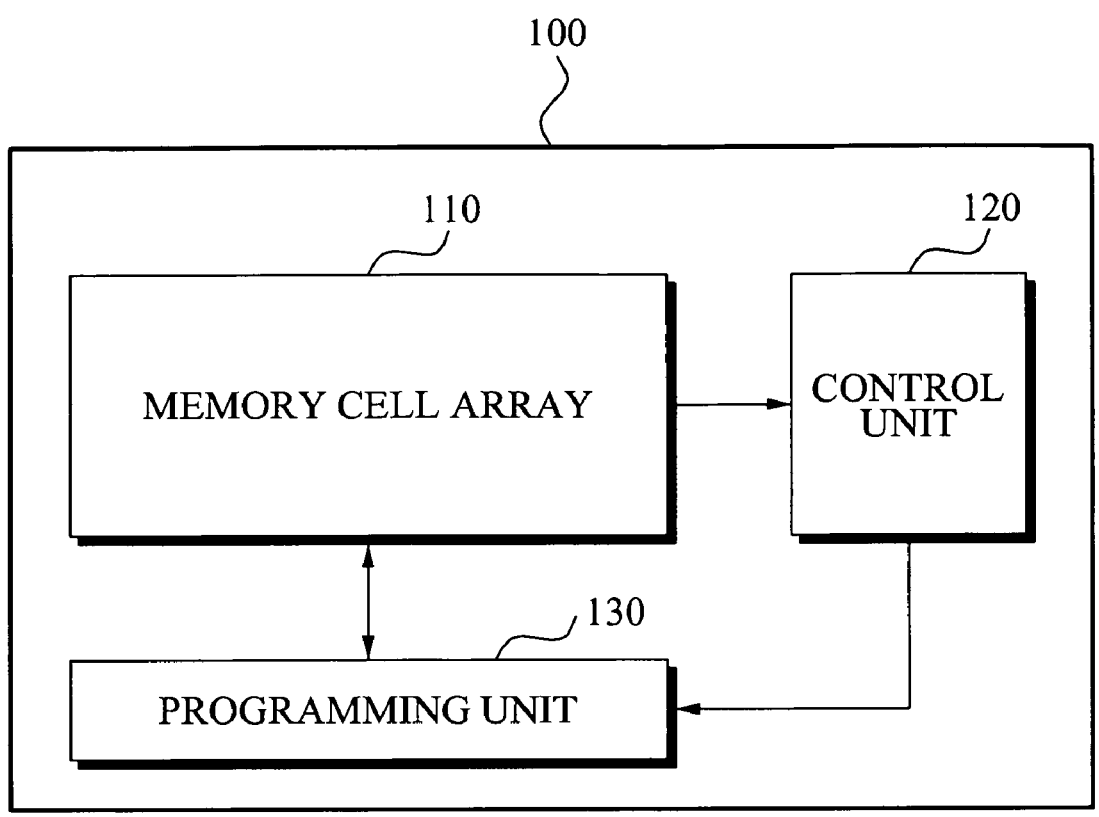
FIG. 1 is a block diagram illustrating an example of a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will be described in detail. It should be understood, however, that there is not intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Spatially relative terms, for example "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, for example those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made to example embodiments, which are illustrated in the accompanying drawings, wherein like reference numerals may refer to like components throughout.

FIG. 1 illustrates an example of a memory device 100 according to example embodiments.

Referring to FIG. 1, the memory device 100 may include a memory cell array 110, a controller 120, and a programming unit 130.

The memory cell array 110 may include a plurality of memory cells. The programming unit 130 may change a threshold voltage of each of the memory cells to thereby store data in each of the memory cells.

A process of storing data by changing the threshold voltage of the memory cell may be referred to as "programming". The memory device 100 may set a target threshold voltage interval of the memory cell based on the data to be stored in the memory cell. The programming unit 130 may change the threshold voltage of the memory cell to be included in the set target threshold voltage interval.

For example, the memory device 100 may set a target threshold voltage interval of between 1 V and 2 V with respect to a memory cell to store data "1" and may set a target threshold voltage interval of between 3 V and 4 V with respect to a memory cell to store data "0".

The programming unit 130 may change a threshold voltage of the memory cell to store data "1" to be included in the target threshold voltage interval of 1V and 2V. The programming unit 130 may change a threshold voltage of the memory cell to store data "0" to be included in the target threshold voltage interval of between 3V and 4V.

According to example embodiments, the programming unit 130 may change a threshold voltage of a memory cell based on a comparison with a verify voltage. The memory device 100 may set a verify voltage of the memory cell based on data to be stored in the memory cell.

For example, the memory device 100 may set a verify voltage of 1V with respect to the memory cell to store data "1", and may set a verify voltage of 3V with respect to the memory cell to store data "0". The programming unit 130 may change a threshold voltage of the memory cell in which data "1" is to be stored, so that the memory cell in which data "1" is to be stored may have a threshold voltage greater than the 1V verify voltage. The programming unit 130 may change a threshold voltage of the memory cell in which data "0" is to be stored so that the memory cell in which data "0" is to be stored may have a threshold voltage greater than the 3V verify voltage.

The programming unit 130 may apply, to the memory cell, a condition voltage capable of changing the threshold voltage of the memory cell in a predetermined time slot. After the predetermined time slot is completed, the programming unit 130 may compare the threshold voltage of the memory cell with the verify voltage or the target threshold voltage interval. When the threshold voltage of the memory cell is greater than the verify voltage or is included in the target threshold voltage interval, the programming unit 130 may suspend changing of the threshold voltage of the memory cell.

When the memory cell is a multi-bit cell that stores multi-bit data, the memory device 100 may store m-bit data using $2^m$ verify voltage levels or target threshold voltage intervals. The memory device 100 may set $2^m$ verify voltage levels and select any one verify voltage level from $2^m$ verify voltage levels based on data to be stored in the memory cell. The programming unit 130 may change the threshold voltage of the memory cell using the selected verify voltage level.

The memory cell of the memory device 100 may include a control gate and a floating gate to store data according to change in the threshold voltage. An insulating layer may be disposed between the control gate and the floating gate. Another insulating layer may be inserted between the floating gate and a substrate.

A programming process of storing data in the memory cell, or an erase process of erasing data stored in the memory cell may be performed according to mechanism, for example Fowler-Nordheim (F-N) tunneling, hot carrier effect, and the like.

Under a particular bias condition, a channel may be formed in a region most adjacent to the floating gate on a substrate region. The channel may be a region generated by clustering together minority carriers of the substrate region. The memory device 100 may control the minority carriers to thereby program data in the memory cell, or to erase the data stored in the memory cell.

When a particular bias is applied to a source, a drain, and a control gate of the substrate region, the minority carriers of the channel may move to the floating gate. Mechanisms of moving the minority subcarriers to the floating gate may representatively include hot carrier effect and F-N tunneling.

Memory cells storing the same data may be programmed based on the same target threshold voltage interval or the same verify voltage. According to example embodiments, electrical characteristics of each memory cell may be minutely different and thus a threshold voltage of the memory cells storing the same data may form a distribution with a predetermined range.

A programming process of the memory cell may give some undesired affect to a threshold voltage of surrounding memory cells, which may occur due to, for example, FG coupling, program disturbance, and the like.

FG coupling may denote a phenomenon where a threshold voltage of a central memory cell is affected by a change amount of threshold voltage of surrounding memory cells. Due to coupling of a parasitic capacitance between floating gates of memory cells, the threshold voltage of the central memory cell may be affected.

If the programming process increases the threshold voltage, FG coupling may cause the threshold voltage of the central memory to be increased to be greater than a desired value. Due to mechanism, for example FG coupling, a distribution of threshold voltage of memory cells may be spread.

Since a voltage window where a multi-bit cell operates is limited, a distribution of the threshold voltage may overlap another distribution of an adjacent threshold voltage as the distribution of the threshold voltage spreads. As an overlapping level of the threshold voltage increases, an error rate of inaccurately reading programmed data may also increase. When the memory cell is a multi-bit cell that stores m-bit data, the threshold voltage of memory cells of the memory cell array 110 may form $2^m$ distributions. As m increases, the error rate may increase due to undesired spread of the distribution.

The program disturbance may denote a phenomenon where the threshold voltage of surrounding memory cells is affected by a program condition voltage programmed in the memory cell. Due to the program disturbance, the threshold voltage of the memory cell may undergo undesired affects due to the programming.

Charge loss over time and the like may cause the undesired change in a threshold voltage of memory cells.

In comparison to F-N tunneling, hot carrier effect may move carriers relatively fast, but may inflict a relatively large amount of physical damage to the insulating layer disposed between the floating gate and the substrate. F-N tunneling may inflict a relatively small amount of damage to the insulating layer. However, when a number of times the data is programmed in the memory cell and the data is erased in the memory cell increases, damage thereof may not be insignificant.

When charges are formed by accumulating carriers in the floating gate, data of the memory cell may be determined based on the formed charges. According to example embodiments, if the insulating layer surrounding the floating gate is physically damaged, a charge leaking path may be formed in the insulating layer.

Charges charged to the floating gate may need to be maintained in the floating gate until a discharging condition is prepared. However, the charges charged in the floating gate may spread due to a natural spreading phenomenon. If the insulating layer surrounding the floating gate is damaged and thereby the charge leaking path is formed, the charges charged in the floating gate may be lost. The charge loss mechanism, which may cause the charges charged to the floating gate to become lost, may decrease the threshold voltage of the memory cell.

The controller 120 may extract state information of each of the memory cells and divide the plurality of memory cells into a first group and a second group based on the extracted state information. The controller 120 may assign a first verify voltage to memory cells of the first group and assign a second verify voltage to memory cells of the second group.

The programming unit 130 may change a threshold voltage of each memory cell of the first group until the threshold voltage of each memory cell of the first group is greater than or equal to the first verify voltage. The programming unit 130 may change a threshold voltage of each memory cell of the second group until the threshold voltage of each memory cell of the second group is greater than or equal to the second verify voltage.

A process of programming data in the memory cell may require a relatively longer period of time than a process of reading data from the memory cell. Since it may take a relatively long to program the data in the memory cell, the memory device 100 may simultaneously program data in a plurality of memory cells and may thereby reduce a total data programming time. Herein, a set of the simultaneously programmed memory cells may be referred to as a page. For example, a single page may include a thousand memory cells. The memory cell array 110 may include a thousand of pages.

According to example embodiments, the programming unit 130 may simultaneously program data in memory cells connected to a single word line. The word line may be connected to a gate terminal of each of memory cells included in the single page.

The memory device 100 may select a page corresponding to a memory address that corresponds to data to be stored, and select a word line that is connected with memory cells included in the selected page. The programming unit 130 may apply a program voltage to the selected word line and thereby enable the memory cells included in the selected page to reach a program preparation state.

Among the memory cells of the first group, the programming unit 130 may apply a program inhibit voltage to a bit line connected to a memory cell with a threshold voltage greater than or equal to a first verify voltage and may apply a program condition voltage to a bit line connected to a memory cell with a threshold voltage less than the first verify voltage.

Among the memory cells of the second group, the programming unit 130 may apply the program inhibit voltage to a bit line connected to a memory cell with a threshold voltage greater than or equal to a second verify voltage and may apply the program condition voltage to a bit line connected to a memory cell with a threshold voltage less than the second verify voltage.

Among memory cells with the applied program condition voltage, a memory cell with a fast changing threshold voltage may be referred to as a fast cell and a memory cell with a slowly changing threshold voltage may be referred to as a slow cell. The controller 120 may extract state information of each of memory cells included in the memory cell array 100 and determine which of the fast cell or the slow cell each of the memory cells are based on the extracted state information. The state information may be a change amount of threshold voltage of each memory cell while the program condition voltage is being applied.

The controller 120 may assign, to the first group, memory cells determined as the fast cell. The controller 120 may assign, to the second group, memory cells determined as the slow cell.

The controller 120 may assign the first verify voltage to memory cells included in a single page, in a first time slot. The programming unit 130 may apply, at least once, a pulse corresponding to the program voltage to a gate terminal of each of the memory cells included in the page in the first time slot. The memory device 100 may identify, from the memory cells included in the page, the memory cell with the threshold voltage less than the first verify voltage every time after the pulse is applied. While the pulse corresponding to the program voltage is being applied, the programming unit 130 may apply the program condition voltage to a bit line connected to the identified memory cell.

The controller 120 may determine, as the fast cells, the memory cells with threshold voltages greater than or equal to the first verify voltage after the first time slot is completed. The memory cell with the threshold voltage greater than or equal to the first verify voltage after the first time slot is completed may be determined to have experienced a change in threshold voltage relatively quickly in comparison to other memory cells that are under the same bias condition. The controller 120 may assign, to the first group, the memory cell determined as the fast cell.

The controller 120 may determine, as the slow cell, a memory cell with a threshold voltage less than the first verify voltage after the first time slot is completed. The controller 120 may assign, to the second group, the memory cell determined as the slow cell.

According to example embodiments, the controller 120 may set, as the second verify voltage, a voltage greater than the first verify voltage. According to example embodiments, the controller 120 may assign the first verify voltage to the fast cell of the first group and assign the second verify voltage to the slow cell of the second group. Since the fast cell may reach the first verify voltage in the first time slot, the memory device 100 may apply the program inhibit voltage to a bit line connected to the fast cell in the second time slot. The memory device 100 may minimize or reduce the change in the threshold voltage of the fast cell by applying the program inhibit voltage to the bit line connected to the fast cell in the second time slot. In the second time slot where the programming operation for the slow cell is performed, the threshold voltage of the fast cell may be affected. Mechanisms that affect the threshold voltage of the fast cell during the programming operation for the slow cell may be, for example, program disturbance, FG coupling, and the like.

The memory device 100 may set the target threshold voltage interval or the verify voltage based on data to be stored in the memory cell. According to example embodiments, the memory device 100 may set the first verify voltage to be less than a verify voltage, or may set the verify voltage as the second verify voltage, based on a distribution distortion of the threshold voltage that may occur due to program disturbance or FG coupling. The fast cell may be programmed to have a threshold voltage greater than or equal to the first verify voltage by the memory device 100. While the programming operation for the slow cell is being performed, the threshold voltage of the fast cell may increase to be greater than or equal to the second verify voltage by program disturbance or FG coupling. The slow cell may be programmed to have a threshold voltage greater than or equal to the second verify voltage by the memory device 100. Accordingly, the memory device 100 may program all the memory cells to have a threshold voltage greater than or equal to a corresponding verify voltage based on an affect by FG coupling or program disturbance.

According to example embodiments, the memory device 100 may set the first verify voltage greater than the verify voltage based on the distribution distortion of threshold voltage that may occur due to charge loss. The memory device 100 may assign the first verify voltage to a memory cell included in the first group and assign the second verify voltage, to a memory cell included in the second group. In a case where the fast cell is greatly affected due to the charge loss, the memory device 100 may assign the first verify voltage to the fast cell and assign the second verify voltage to the slow cell. The threshold voltage of the fast cell may decrease over time to be less than the first verify voltage, whereas the threshold voltage of the fast cell may be still higher than the second verify voltage that may be less than the first verify voltage.

According to example embodiments, the controller 120 may determine the first verify voltage and the second verify voltage based on data to be programmed in the memory cell. For example, when the memory cell is a multi-bit cell that stores three-bit data, the controller 120 may identify, from memory cells included in the page, memory cells with data "101" to be programmed and divide the identified memory cells into the first group and the second group.

According to example embodiments, the programming unit 130 may apply, a number N times, the pulse corresponding to the program voltage to the gate terminal of each of memory cells included in the first page, in the first time slot. The memory device 100 may record a number of times that the pulse corresponding to the program voltage is applied. When the number of times that the pulse corresponding to the program voltage is N times, the memory device 100 may terminate the first time slot and inform the controller 120 that the first time slot is terminated.

According to example embodiments, when a number of memory cells with a threshold voltage greater than or equal to the first verify voltage among the memory cells included in the page is greater than or equal to a number N, the controller 120 may terminate the first time slot.

According to example embodiments, the controller 120 may divide the memory cells included in the page, into K groups. The controller 120 may set k verify voltage levels. For example, if a target threshold voltage is Vtarget, the relationship that Vk=Vtarget and V1<V2<...Vk may be established. The controller 120 may separate, into first group G1, a memory cell with a threshold voltage greater than or equal to V1 after the pulse corresponding to the program voltage is applied L1 times. The controller 120 may separate, into second group G2, a memory cell with a threshold voltage greater than or equal to V2 after the pulse corresponding to the program voltage is applied L2 times where L2>L1.

According to example embodiments, the controller 120 may divide, into k groups, memory cells included in the page. When the number of memory cells with the threshold voltage greater than or equal to V1 is greater than or equal to N1, the controller 120 may separate, into the first group G1, the memory cell with the threshold voltage greater than or equal to V1 and program remaining memory cells excluding memory cells included in the first group G1, using second verify voltage V2. When the number of memory cells with the threshold voltage greater than or equal to V2 is greater than or equal to N2, the controller 120 may separate, into the second group G2, the memory cell with the threshold voltage greater than or equal to V2 and program remaining memory cells excluding memory cells included in the first group G1 and second group G2, using third verify voltage V3.

The memory device 100 may identify the fast cell and the slow cell based on a change amount of threshold voltage of the memory cell while the programming operation is being performed. While the programming operation is being performed, the memory device 100 may determine characteristics of the memory cell and may also determine programming strategies associated with the memory cell based on the characteristics.

Figure 2:
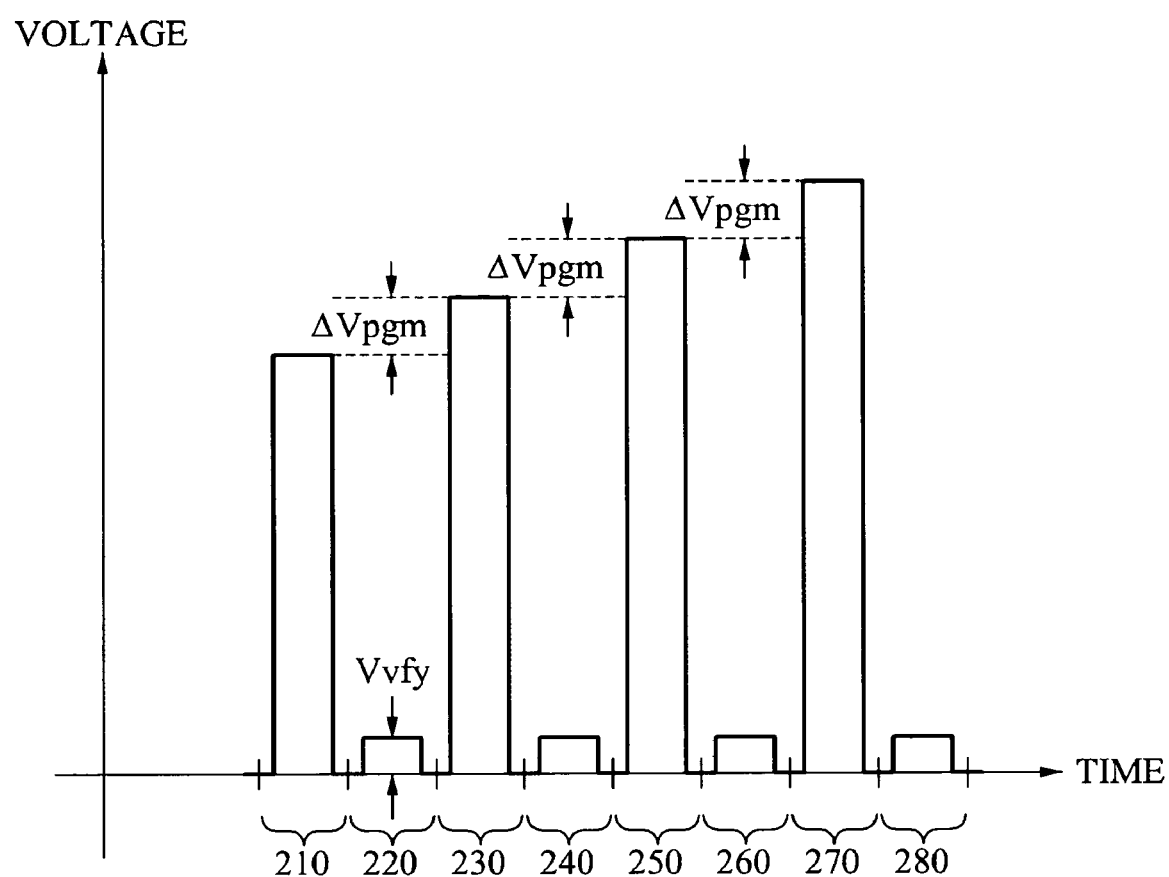
FIGS. 2 through 5 illustrate an example of an operation of the memory device shown in FIG. 1.

FIG. 2 illustrates an example of an operation of the memory device 100 shown in FIG. 1.

FIG. 2 shows a voltage applied to a gate terminal of a memory cell included in a selected page over time.

In a time slot 210, the programming unit 130 may apply a pulse corresponding to program voltage Vpgm to the gate terminal of the memory cell included in the selected page. According to example embodiments, the selected page may be a set of memory cells connected to a single word line. The word line may be connected to a gate terminal of each of memory cells included in the selected page. The programming unit 130 may apply, via the word line, the pulse corresponding to program voltage Vpgm to the gate terminal of the memory cell included in the selected page.

In a time slot 220, the memory device 100 may apply a pulse corresponding to verify voltage Vvfy to the gate terminal of the memory cell included in the selected page. According to example embodiments, the memory device 100 may sense a voltage or current of the bit line connected to the memory cell included in the selected page to thereby determine whether a threshold voltage of the memory cell included in the selected page is greater than verify voltage Vvfy. The memory device 100 may identify, from a plurality of memory cells included in the selected page, a memory cell with a threshold voltage less than verify voltage Vvfy.

In a time slot 230, the programming unit 130 may apply a pulse corresponding to program voltage Vpgm+Δ Vpgm to the gate terminal of the memory cell included in the selected page. The programming process of sequentially incrementing a voltage corresponding to an applied pulse may be referred to as an incremental step pulse program (ISSP). According to example embodiments, the programming unit 130 may apply the program condition voltage to a bit line connected to the identified memory cell in the previous time slot 220.

In a time slot 240, the memory device 100 may apply a pulse corresponding to verify voltage Vvfy to the gate terminal of the memory cell included in the selected page. According to example embodiments, the memory device 100 may determine whether a threshold voltage of the memory cell included in the selected page is greater than verify voltage Vvfy. The memory device 100 may identify, from the plurality of memory cells included in the selected page, a memory cell that a threshold voltage thereof becomes greater than or equal to verify voltage Vvfy by the pulse applied in the previous time slot 230.

In a time slot 250, the programming unit 130 may apply a pulse corresponding to program voltage Vpgm+2 Δ Vpgm to the gate terminal of the memory cell included in the selected page. The programming unit 130 may apply the program condition voltage to a bit line connected to a memory cell that is determined to have a threshold voltage less than verify voltage Vvfy. In a time slot 260, the memory device 100 may apply a pulse corresponding to verify voltage Vvfy to the gate terminal of the memory cell included in the selected page.

In a time slot 270, the programming unit 130 may apply a pulse corresponding to program voltage Vpgm+3 Δ Vpgm to the gate terminal of the memory cell included in the selected page. In a time slot 280, the memory device 100 may apply a pulse corresponding to verify voltage Vvfy to the gate terminal of the memory cell included in the selected page. According to example embodiments, the memory device 100 may determine a verify voltage to be applied in the time slot 280 based on a number of times that the pulse has been applied by the previous time slot 270. According to example embodiments, the memory device 100 may determine the verify voltage to be applied in the time slot 280 based on a number of memory cells that are determined to have a threshold voltage greater than or equal to verify voltage Vvfy in the previous time slot 260.

Figure 3:
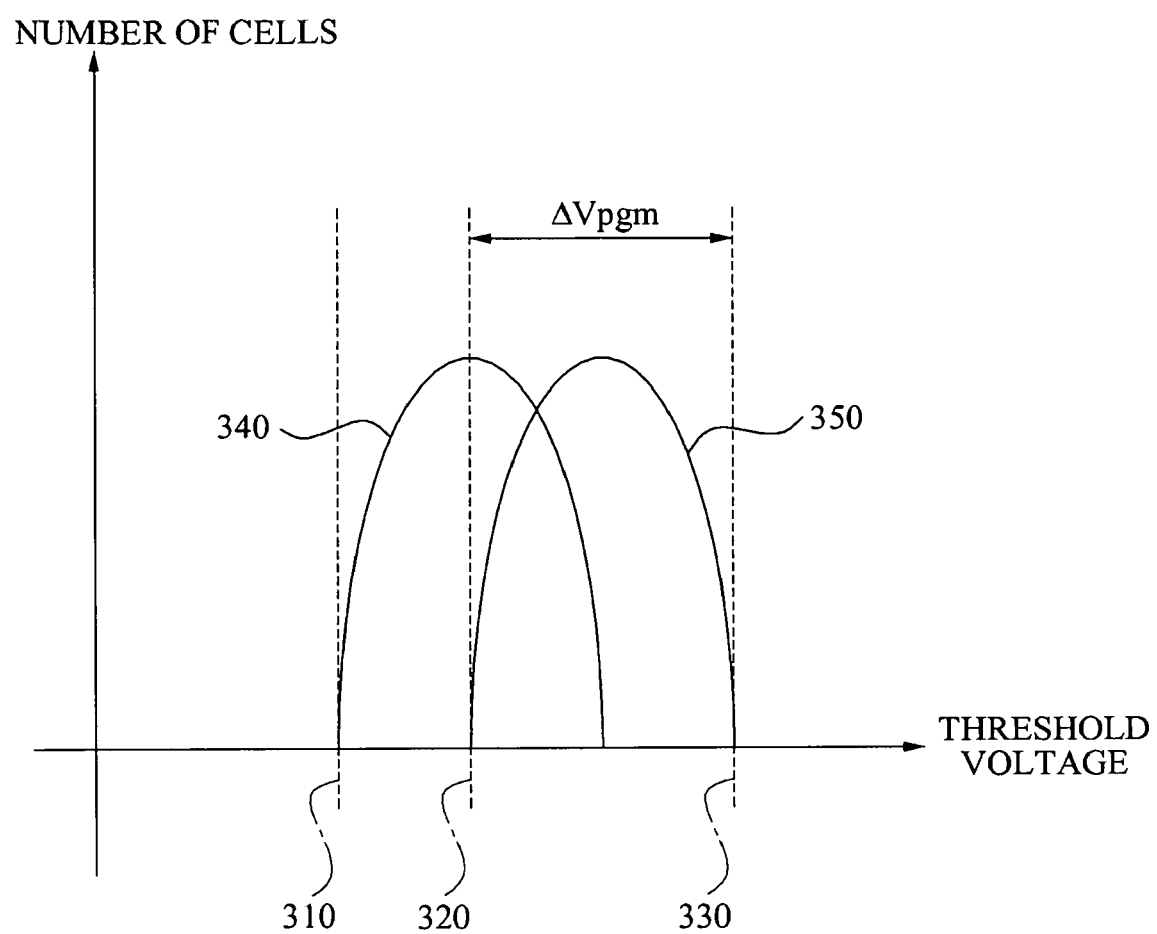

FIG. 3 illustrates another example of an operation of the memory device 100 shown in FIG. 1.

A graph of FIG. 3 shows a distribution of threshold voltages of a plurality of memory cells included in the memory cell array 110.

The memory device 100 may program the plurality of memory cells using a first verify voltage corresponding to a voltage level 310 in a first time slot.

After the first time slot is completed, threshold voltages of fast cells among the plurality of memory cells may form a distribution 340. Since a threshold voltage of a fast cell may increase faster than a threshold voltage of a slow cell, the threshold voltage of the fast cell may increase to be greater than the voltage level 310 before the threshold voltage of the slow cell increases to be greater than the voltage level 310. The memory device 100 may apply, to a fast cell corresponding to the distribution 340, a program inhibit voltage that enables the threshold voltage of the fast cell corresponding to the distribution 340 to be maintained after the first time slot is completed by, for example, prevent the threshold voltage of the fast cell from changing.

In a second time slot, the memory device 100 may program slow cells among the plurality of memory cells, using a second verify voltage corresponding to a voltage level 320. The memory device 100 may apply an $i^{th}$ pulse corresponding to $i^{th}$ program voltage Vpgm(i) and then apply an $(i+1)^{th}$ pulse corresponding to $(i+1)^{th}$ program voltage Vpgm(i+1).

According to example embodiments, the relationship that Vpgm(i+1)=Vpgm(i)+Δ Vpgm may be established.

A memory cell where a threshold voltage becomes Vth(i) after the $i^{th}$ pulse is applied may have the threshold voltage of Vth(i+1) after the $(i+1)^{th}$ pulse is applied. The relationship of Vth(i+1)=Vth(i)+Δ Vpgm may be established. The memory device 100 may increase a threshold voltage of a memory cell with a threshold voltage less than the voltage level 320 in the second time slot. Therefore, a threshold voltage of a memory cell where a threshold voltage becomes greater than or equal to the voltage level 320 due to the $i^{th}$ pulse may be included in a threshold voltage interval of [voltage level 320, voltage level 320+Δ Vpgm]. If a voltage corresponding to voltage level 320+Δ Vpgm is a voltage level 330, threshold voltages of slow cells that are programmed in the second time slot by the memory device 100 may form a distribution 350. The distribution 350 may be included in a threshold voltage interval of [voltage level 320, voltage level 330] and may also have the width of Δ Vpgm.

Figure 4:
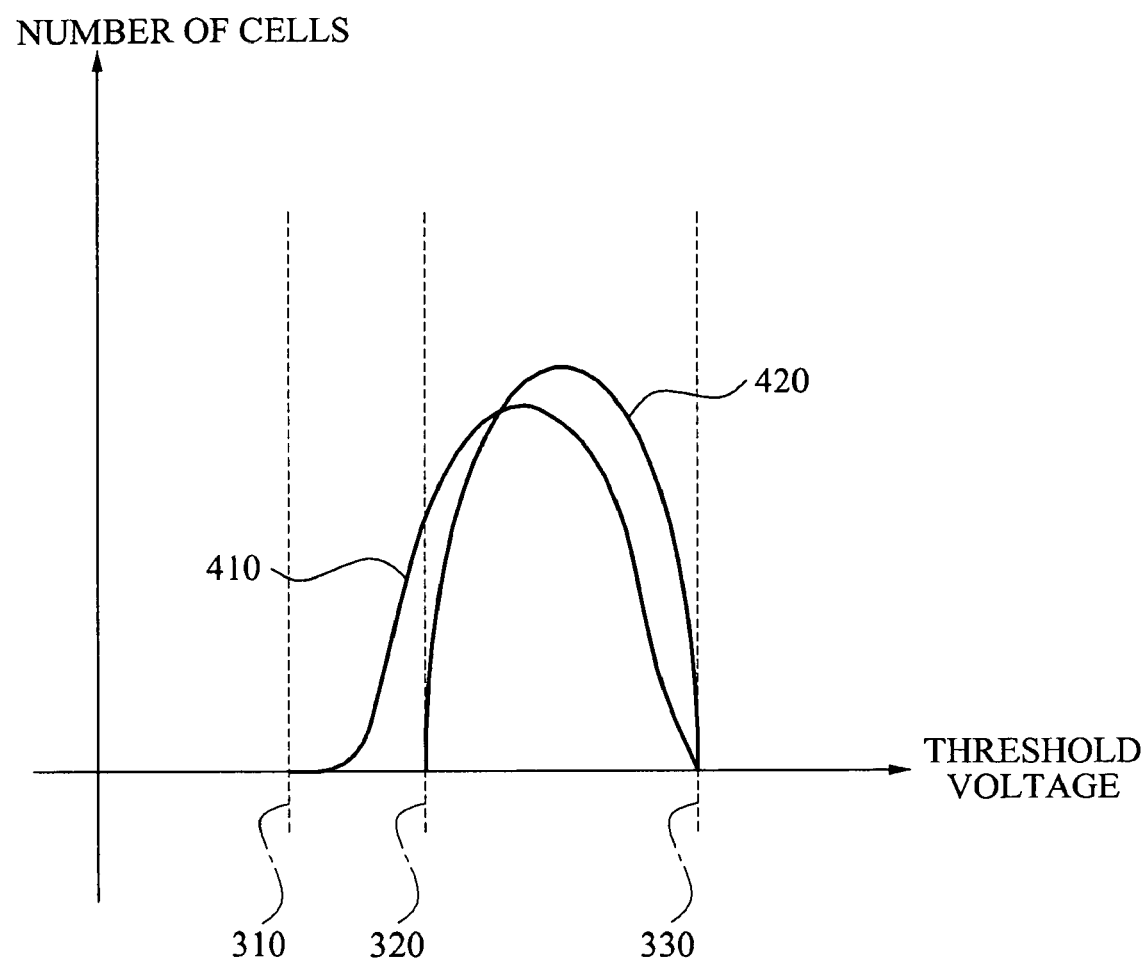

FIG. 4 illustrates still another example of an operation of the memory device 100 shown in FIG. 1.

A graph of FIG. 4 shows a distribution of threshold voltages of a plurality of memory cells included in the memory cell array 110.

The memory device 100 may program the plurality of memory cells using the first verify voltage corresponding to the voltage level 310 in the first time slot. As described above, after the first time slot is completed, threshold voltages of fast cells among the plurality of memory cells may form the distribution 340 of FIG. 3.

In the second time slot, the memory device 100 may program slow cells among the plurality of memory cells using a second verify voltage corresponding to the voltage level 320. After the second time slot is completed, threshold voltages of the slow cells among the plurality of memory cells may form a distribution 420.

Due to FG coupling or program disturbance, a threshold voltage of a fast cell may be affected by a programming operation that is performed in the second time slot. FG coupling or program disturbance may increase a threshold voltage of a memory cell. After the second time slot is completed, the threshold voltages of the fast cells may form a distribution 410.

Figure 5:
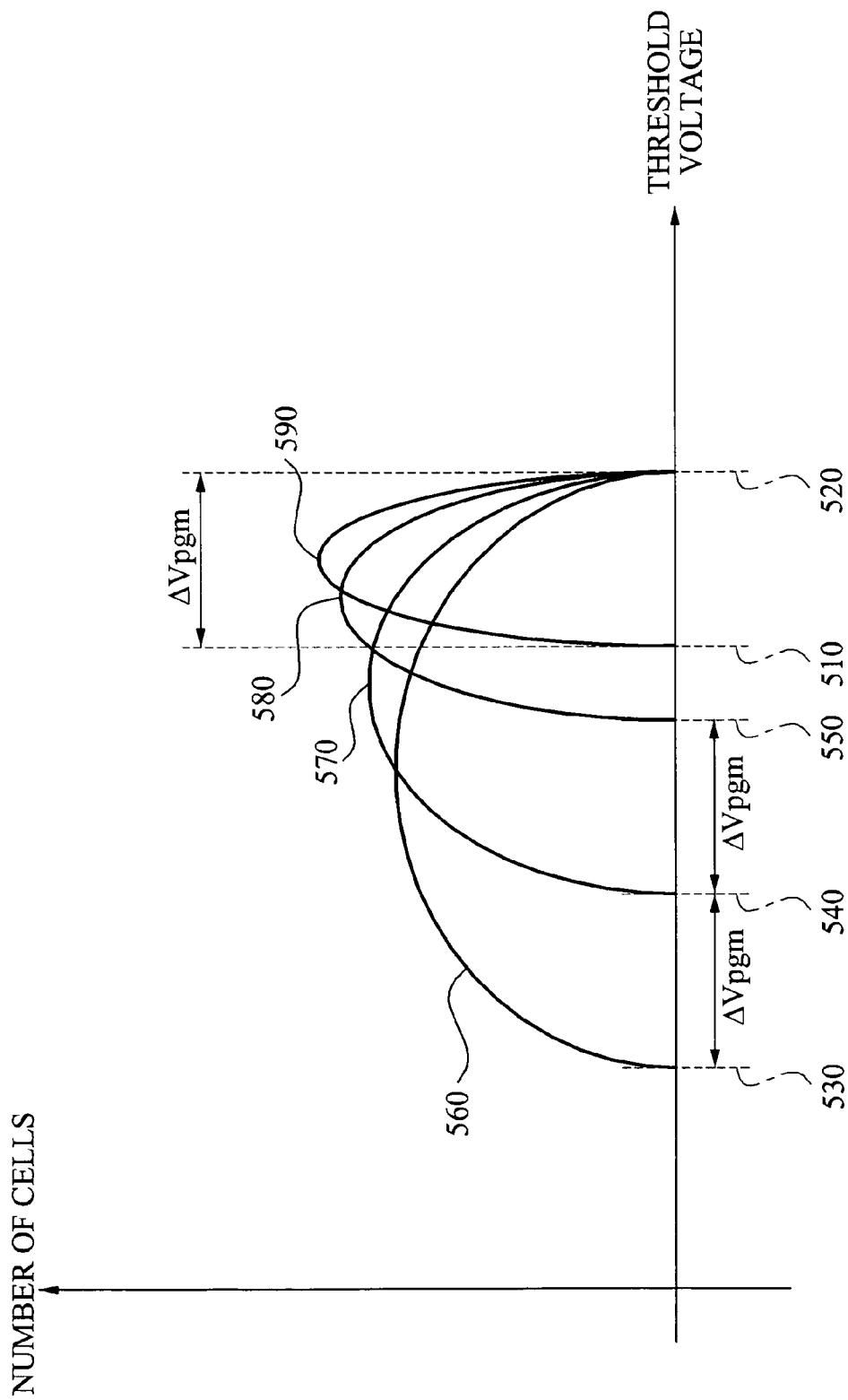

FIG. 5 illustrates yet another example of an operation of the memory device 100 shown in FIG. 1.

A graph of FIG. 5 shows a distribution of threshold voltages of memory cells included in a second group by the controller 120 among a plurality of memory cells included in the memory cell array 110.

The threshold voltages of memory cells included in the second group may form a distribution 560 before an $i^{th}$ pulse is applied. A memory cell corresponding to the distribution 560 may have a threshold voltage greater than or equal to a voltage level 530. The memory device 100 may apply the $i^{th}$ pulse to a gate terminal of each of the memory cells corresponding to the distribution 560. The memory device 100 may increase a threshold voltage of a memory cell with a threshold voltage less than a voltage level 510 among the memory cells corresponding to the distribution 560.

After the $i^{th}$ pulse is applied, the threshold voltages of the memory cells included in the second group may form a distribution 570. A memory cell corresponding to the distribution 570 may have a threshold voltage greater than or equal to a voltage level 540. The voltage level 540 may be a voltage level increased to be greater than the voltage level 530 by Δ Vpgm.

The memory device 100 may apply an $(i+1)^{th}$ pulse to a gate terminal of each of the memory cells corresponding to the distribution 570. The memory device 100 may increase a threshold voltage of a memory cell with a threshold voltage less than the voltage level 510 among the memory cells corresponding to the distribution 570.

After the $(i+1)^{th}$ pulse is applied, the threshold voltages of the memory cells included in the second group may form a distribution 580. A memory cell corresponding to the distribution 580 may have a threshold voltage greater than or equal to a voltage level 550. The voltage level 550 may be a voltage level increased to be greater than the voltage level 540 by Δ Vpgm.

The memory device 100 may apply an $(i+2)^{th}$ pulse to a gate terminal of each of the memory cells corresponding to the distribution 580. The memory device 100 may increase a threshold voltage of a memory cell with a threshold voltage less than the voltage level 510 among the memory cells corresponding to the distribution 580.

After the $(i+2)^{th}$ pulse is applied, the threshold voltages of the memory cells included in the second group may form a distribution 590. A memory cell corresponding to the distribution 590 may have a threshold voltage greater than or equal to the voltage level 510. When the threshold voltage of the memory cell increases by Δ Vpgm according to a single pulse, the distribution 590 may have the width of Δ Vpgm. According to example embodiments, the distribution 590 may be included in a threshold voltage interval of [voltage level 510, voltage level 520]. The voltage level 520 may be a voltage level increased to be greater than the voltage level by Δ Vpgm.

The memory cells included in the second group have been described above generally with reference to FIG. 5, however a programming process associated with memory cells included in the first group may also be similarly performed.

Figure 6:
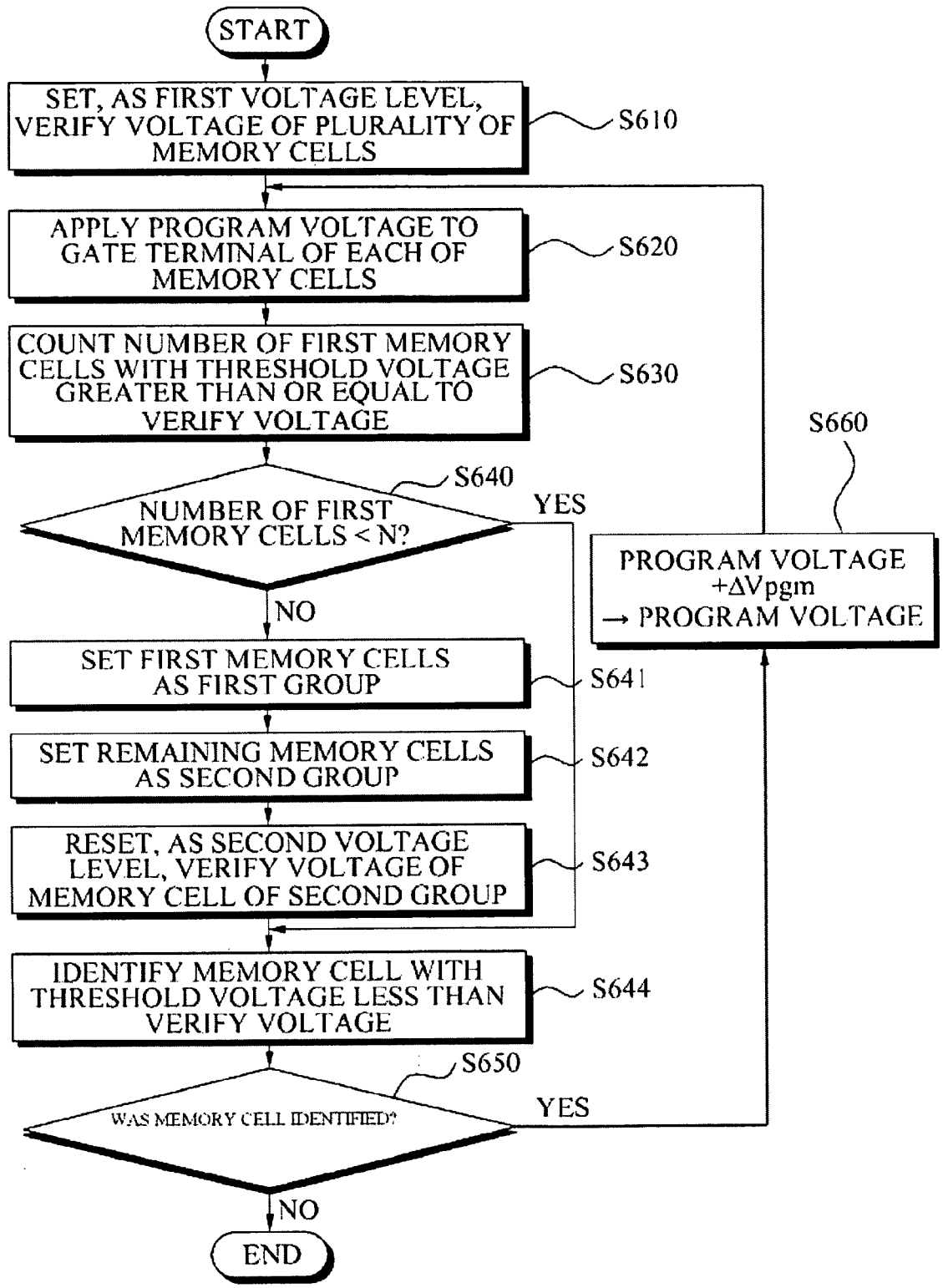
FIG. 6 is a flowchart illustrating an example of a memory programming method according to example embodiments.

FIG. 6 is a flowchart illustrating an example of a memory programming method according to example embodiments.

Referring to FIG. 6, in operation S610, the memory programming method may include setting a verify voltage for a plurality of memory cells as a first voltage level.

In operation S620, the memory programming method may include applying a program voltage to a gate terminal of each of the memory cells.

In operation S630, the memory programming method may include counting a number of first memory cells which may be memory cells with a threshold voltage greater than or equal to the verify voltage.

In operation S640, the memory programming method may include determining whether the number of first memory cells is less than a number N.

In operation S641, when the number of first memory cells is greater than or equal to the number N, the memory programming method may include setting the first memory cells as a first group.

In operation S642, the memory programming method may include setting, as a second group, remaining memory cells excluding the first memory cells from the plurality of memory cells.

In operation S643, the memory programming method may include setting, as a second voltage level, a verify voltage of a memory cell included in the second group.

According to example embodiments, the programming method may maintain a verify voltage of a memory cell of a first group at the first voltage level.

Conversely, in operation S644, the memory programming method may include identifying a memory cell with a threshold voltage less than the verify voltage when the number of first memory cells is less than the threshold N.

After operation S643 is performed, the memory programming method may identify the memory cell with a threshold voltage less than the verify voltage. According to example embodiments, the memory programming method may include comparing the threshold voltage of the memory cell of the first group with the first voltage level and may also compare the threshold voltage of the memory cell of the second group with the second voltage level.

In operation S650, the memory programming method may include determining whether a memory cell with a threshold voltage less than the verify voltage exists. When the identified memory cell does not exist, the programming sequence may be terminated.

Conversely, in operation S660, when a memory cell with a threshold voltage less than the verify voltage exists, the memory programming method may increase the program voltage by $\Delta Vpgm$.

Operation S620 maybe performed using the increased program voltage. According to example embodiments, the memory programming method may include applying a program condition voltage to a bit line connected to the identified memory cell while the increased program voltage is being applied to the gate terminal of each of the memory cells. While the increased program voltage is being applied to the gate terminal of each of the memory cells, the memory programming method may apply a program inhibit voltage to a bit line connected to remaining memory cells excluding the identified memory cell.

Figure 7:
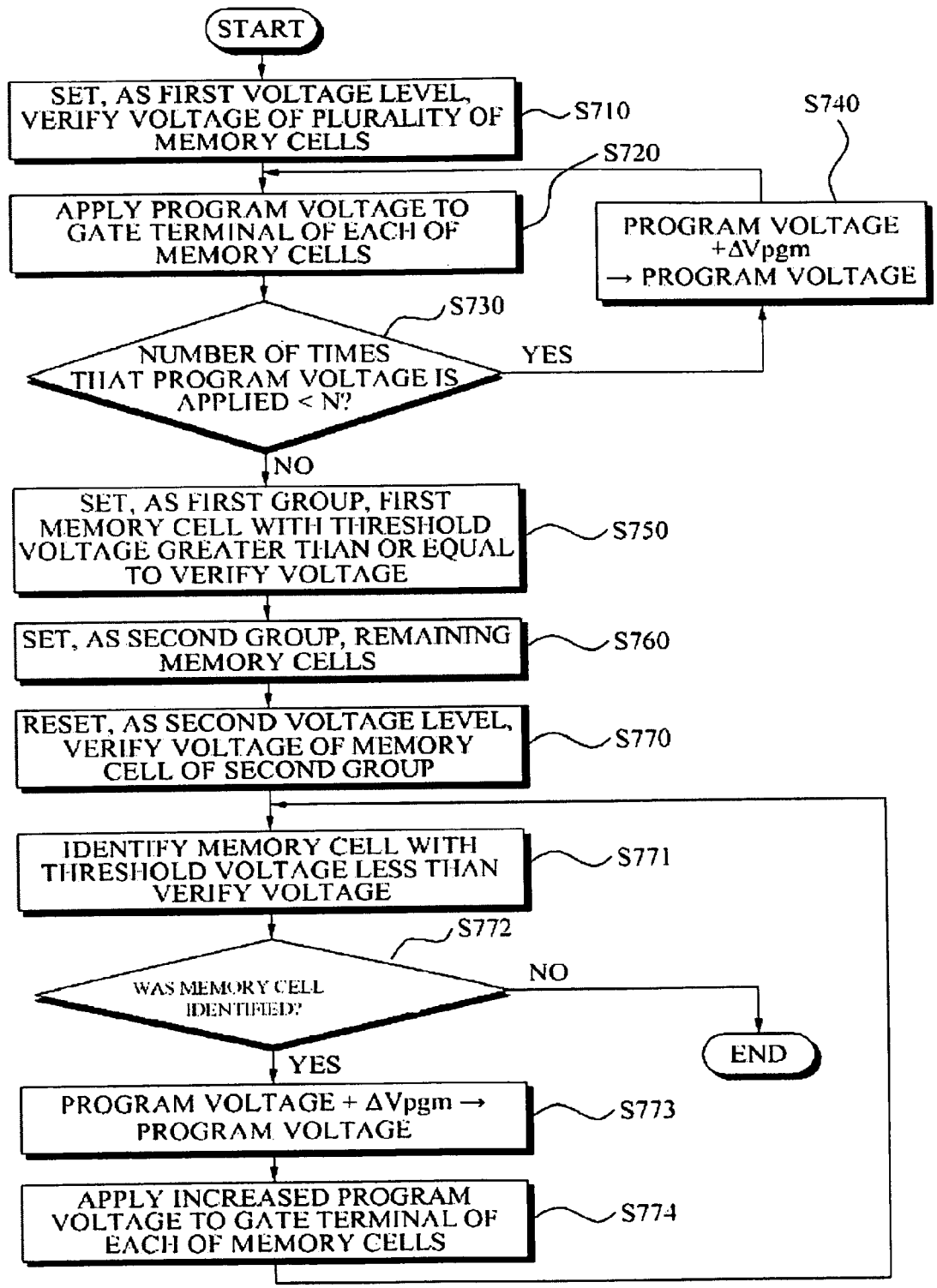
FIG. 7 is a flowchart illustrating another example of a memory programming method according to example embodiments.

FIG. 7 is a flowchart illustrating another example of a memory programming method according to example embodiments.

Referring to FIG. 7, in operation S710, the memory programming method may include setting a verify voltage of a plurality of memory cells as a first voltage level.

In operation S720, the memory programming method may include applying a program voltage to a gate terminal of each of the memory cells.

In operation S730, the memory programming method may include determining whether a number of times that the program voltage is applied is less than threshold N.

In operation S740, the memory programming method may include increasing the program voltage by $\Delta Vpgm$ when the number of times that the program voltage is applied is less than the threshold N.

According to example embodiments, the memory programming method may include applying the program voltage, increased by $\Delta Vpgm$, to the gate terminal of each of the memory cells in operation S720. According to example embodiments, the memory programming method may include identifying a threshold voltage less than a verify voltage from the plurality of memory cells before applying the increased program voltage to the gate terminal of each of the memory cells. In operation S720, the memory programming method may include applying a program condition voltage to a bit line connected to the identified memory cell while the increased program voltage is being applied. Also, in operation S720, the memory programming method may include applying a program inhibit voltage to a bit line connected to remaining memory cells excluding the identified memory cell while the increased program voltage is being applied.

Conversely, in operation S750, the memory programming method may include setting, as the first group, a first memory cell with a threshold voltage greater than or equal to the verify voltage when the number of times that the program voltage is applied is greater than or equal to the threshold N.

In operation S760, the memory programming method may set, as the second group, remaining memory cells excluding the first memory cell.

In operation S770, the memory programming method may set, as a second voltage level, a verify voltage of a memory cell of the second group. The memory programming method may maintain a verify voltage of a memory cell of the first group at the first voltage level.

In operation S771, the memory programming method may include identifying a memory cell with a threshold voltage less than the verify voltage. According to example embodiments, the memory programming method may include comparing the threshold voltage of the memory cell of the first group with the first voltage level and compare the threshold voltage of the memory cell of the second group with the second voltage level.

In operation S772, the memory programming method may include determining whether the identified memory cell exists.

When the identified memory cell does not exist, the programming sequence may be terminated.

Conversely, in operation S773, the memory programming method may include increasing the program voltage by $\Delta Vpgm$ when the identified memory cell exists.

In operation S774, the memory programming method may include applying the increased program voltage to the gate terminal of each of the memory cells.

The memory programming method may include applying the program condition voltage to the bit line connected to the identified memory cell while operation S774 is being performed. The memory programming method may apply the program inhibit voltage to the bit line connected to remaining memory cells excluding the identified memory cell while operation S774 is being performed.

The memory programming method may perform again operation S771 after operation S774 is completed.

The memory programming method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media include magnetic media, for example hard disks, floppy disks, and magnetic tape; optical media, for example CD ROM disks and DVD; magneto-optical media, for example optical disks; and hardware devices that are especially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Example embodiments may be applicable to memory devices that change a threshold voltage of a memory cell to thereby store data, for example, a flash memory, electrically erasable programmable read only memory (EEPROM), a phase shift random access memory (PRAM), a magnetic random access memory (MRAM), and the like.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system, according to example embodiments, may include a microprocessor that may be electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
    a multi-bit cell array that includes a plurality of memory cells;
    a controller that extracts state information of each of the memory cells, divides the plurality of memory cells into a first group and a second group based on the extracted state information, assigns a first verify voltage to memory cells of the first group and assigns a second verify voltage to memory cells of the second group; and
    a programming unit that changes a threshold voltage of each memory cell of the first group until the threshold voltage of each memory cell of the first group is greater than or equal to the first verify voltage, and changes a threshold voltage of each memory cell of the second group until the threshold voltage of each memory cell of the second group is greater than or equal to the second verify voltage.

2. The memory device of claim 1, wherein the controller assigns the first verify voltage to the plurality of memory cells in a first time interval, and in a second time interval after the first time interval is completed, sets, as the first group, a memory cell with the threshold voltage greater than or equal to the first verify voltage and sets, as the second group, remaining memory cells excluding the first group from the plurality of memory cells.

3. The memory device of claim 2, wherein the programming unit applies, a reference number of times, a pulse corresponding to a program voltage to the plurality of memory cells in the first time interval.

4. The memory device of claim 2, wherein, when a number of memory cells with the threshold voltage greater than or equal to the first verify voltage among the plurality of memory cells is greater than a reference number, the controller terminates the first time interval.

5. The memory device of claim 2, wherein the controller sets, as the second verify voltage, a voltage greater than the first verify voltage.

6. The memory device of claim 1, wherein the programming unit applies a pulse corresponding to a program voltage to a gate terminal of each of the memory cells, and applies a program condition voltage to each of bit lines that are connected to a memory cell with a threshold voltage less than the first verify voltage, among the memory cells of the first group, and that are connected to a memory cell with a threshold voltage less than the second verify voltage, among the memory cells of the second group.

7. The memory device of claim 6, wherein the programming unit applies a pulse corresponding to a first program voltage and then applies a pulse corresponding to a second program voltage greater than the first program voltage.

8. The memory device of claim 1, wherein the controller assigns the first verify voltage to the memory cells of the first group and assigns the second verify voltage to the memory cells of the second group, based on data to be programmed in the plurality of memory cells.

9. A memory programming method comprising:
    setting a verify voltage of a plurality of memory cells as a first voltage level;
    applying a first program voltage to a gate terminal of each of the plurality of memory cells to increase a threshold voltage of each of the memory cells;
    dividing the plurality of memory cells into first memory cells and remaining memory cells, the first memory cells being memory cells, from among the plurality of memory cells, with threshold voltages greater than or equal to the verify voltage of the first voltage level;
    resetting the verify voltage of remaining memory cells, excluding the first memory cells, as a second voltage level greater than the first voltage level; and
    applying a second program voltage to the gate terminal of each of the memory cells.

10. The method of claim 9, wherein
    the verify voltage of the remaining memory cells is reset when a number of the first memory cells is greater than or equal to a reference number after the first program voltage is applied.

11. The method of claim 10, further comprising:
identifying, from the plurality of memory cells, a memory cell with a threshold voltage less than the set verify voltage or the reset verify voltage;
applying a program condition voltage to a bit line connected to the identified memory cell while the second program voltage is being applied; and
applying a program inhibit voltage to a bit line connected to the remaining memory cells excluding the identified memory cell while the second program voltage is being applied.

12. The method of claim 10, further comprising:
setting, as the second program voltage, a voltage level greater than the first program voltage.

13. The method of claim 10, wherein the resetting includes:
identifying the first memory cell; and
maintaining a verify voltage of the first memory cell at the first voltage level.

14. The method of claim 10, wherein the resetting includes maintaining the verify voltage of the plurality of memory cells at the first voltage level when the number of first memory cells is less than the reference number.

15. A computer-readable recording medium storing a program for implementing the method of claim 10.

16. The method of claim 9, wherein
the first program voltage is applied a reference number of times, and
the verify voltage of the remaining memory cells is reset after the first program voltage is applied the reference number of times.

17. The method of claim 16, further comprising:
identifying, from the plurality of memory cells, a memory cell with a threshold voltage less than the set verify voltage or the reset verify voltage;
applying a program condition voltage to a bit line connected to the identified memory cell while the second program voltage is being applied; and
applying a program inhibit voltage to a bit line connected to the remaining memory cells excluding the identified memory cell while the second program voltage is being applied.

18. The method of claim 16, further comprising:
setting, as the second program voltage, a voltage level greater than the first program voltage.

19. The method of claim 16, wherein the resetting includes:
identifying the first memory cell; and
maintaining a verify voltage of the first memory cell at the first voltage level.

20. The method of claim 16, wherein the applying of the first program voltage comprises:
identifying, from the plurality of memory cells, a memory cell with a threshold voltage less than the set verify voltage every time after the first program voltage is applied;
applying a program condition voltage to a bit line connected to the identified memory cell while the first program voltage is being applied; and
applying a program inhibit voltage to a bit line connected to remaining memory cells excluding the identified memory cell while the first program voltage is being applied.

21. A computer-readable recording medium storing a program for implementing the method of claim 16.

* * * * *